United States Patent [19]

Pfiester et al.

[11] Patent Number: 4,835,112

[45] Date of Patent: May 30, 1989

[54] CMOS SALICIDE PROCESS USING GERMANIUM IMPLANTATION

[75] Inventors: James R. Pfiester; John R. Yeargain, both of Austin, Tex.

[73] Assignee: Motorola, Inc., Schaumburg, Ill.

[21] Appl. No.: 165,678

[22] Filed: Mar. 8, 1988

[51] Int. Cl.⁴ .......................................... H01L 21/265
[52] U.S. Cl. ..................................... 437/24; 437/27; 437/29; 437/41; 437/200; 437/933; 357/23.1
[58] Field of Search ...................... 437/24, 27, 41, 29, 437/44, 200, 192, 933, 976; 357/23.1, 23.3; 148/DIG. 2, DIG. 40, DIG. 58, DIG. 132

[56] References Cited

U.S. PATENT DOCUMENTS

| | | | |
|---|---|---|---|
| 4,111,719 | 9/1978 | Mader et al. | 437/933 |
| 4,385,938 | 5/1983 | Park et al. | 437/933 |
| 4,558,507 | 12/1985 | Okabayashi et al. | 437/24 |
| 4,616,399 | 10/1986 | Ooka | 437/29 |
| 4,617,066 | 10/1986 | Vasudev | 437/27 |
| 4,622,735 | 11/1986 | Shibata | 437/29 |
| 4,683,645 | 8/1987 | Naguib et al. | 437/41 |

OTHER PUBLICATIONS

B. Davari et al., "Very Shallow Junctions for Submicron CMOS Technology Using Implanted Ti for Silicidation", *ULSI Science and Technology*/1987, Proceedings, vol. 87-11, pp. 368-380.

R. A. Chapman et al., "An 0.8 μm CMOS Technology for High Performance Logic Applications", *IEDM 87 Technical Digest*, Dec. 1987, pp. 362-365.

T. Yoshida et al., "Self-Aligned Titanium Silicided Junctions Formed by Rapid Thermal Annealing in Vacuum", *J. Electrochem. Soc.: Solid-State Science and Tech.*, vol. 135, No. 2, pp. 481-486.

*Primary Examiner*—Brian E. Hearn
*Assistant Examiner*—T. N. Quach
*Attorney, Agent, or Firm*—John A. Fisher

[57] ABSTRACT

A salicided twin-tub CMOS process using germanium implantation to retard the diffusion of the dopants, such as phosphorus and boron. Implantation of n+ and p+ dopants after titanium salicidation is employed to fabricate devices with low junction leakage and good short-channel effects. Also, the germanium dopant may be introduced before or after the formation of the refractory metal silicide formation, and may be implanted independently or together with the dopant whose diffusion in the silicon it will modify. The employment of germanium permits the use of a phosphorus implant through a relatively thick refractory metal silicide contact layer. If arsenic is implanted through the silicide layer to solve the deep junction problem, the silicide layer must be thin to permit the passage of the larger arsenic atoms typically stopped by the silicide. Thinner silicide layers have the disadvantage of higher sheet resistances.

14 Claims, 4 Drawing Sheets

NMOS $L_{eff}$ HISTOGRAM COMPARING PHOSPHORUS ONLY AND PHOS/Ge SOURCE/DRAIN STRUCTURES.

NMOS $I_{off}$ HISTOGRAM COMPARING PHOSPHORUS ONLY AND PHOS/Ge SOURCE/DRAIN STRUCTURES WHERE $V_{gs}=0.3V$ AND $V_{ds}=8.0V$

CMOS SALICIDE PROCESS USING GERMANIUM IMPLANTATION

CROSS REFERENCE TO RELATED APPLICATION

This application is related to pending U.S. patent application Ser. No. 072,932 filed July 13, 1987, relating to n-channel MOS transistors having source/drain regions containing germanium.

FIELD OF THE INVENTION

The invention relates to the fabrication of metal-oxide-semiconductor (MOS) transistors, and more particularly relates, in one aspect, to the fabrication of MOS transistors having source/drain regions with shallow junction depths and a refractory metal silicide contact to the source/drain regions.

BACKGROUND OF THE INVENTION

In the formation of fine-line MOS devices, a recurring and severe problem as the devices become smaller is hot carrier instability (HCI). This problem is related to the shorter channels of the smaller devices, such as when the channel length is 1 micron ($\mu$m) or smaller, and occurs due to high electrical fields between the source and the drain, particularly near the drain that cause carriers, either electrons or holes, to be injected into the gate or substrate. The injection of hot carriers into the gate can cause gate oxide charging and threshold voltage instabilities which accumulate over time and greatly degrade device performance, thus, HCI may also stand for hot carrier injection.

The effect of the high-charge levels in the thin gate dielectric is to shift the MOS field effect transistor (FET) device threshold, which makes it difficult or impossible for the FET device to operate correctly. HCI into gate insulators is a universal problem for small geometry FETs (channel lengths less than or equal to 1 $\mu$m), since most hot carriers are trapped within approximately 100 Å of the semiconductor surface.

This problem has been addressed by attempting to reduce the strength of the electric field near the source and the drain regions. One approach concerns using a graded drain structure, or graded source/drain (GSD). For instance, in an n-channel device, a heavily doped drain of phosphorous or arsenic surrounded by a lighter doping of phosphorus is used to gradually extend the drain region into the channel region to reduce the electric field strength right at the drain. However, this approach can be undesirable in that it causes larger overlap capacitance with the gate, larger lateral diffusion and channel shortening. Typically, merely the deeper junction of the drain produces more disadvantageous short channel effects, such as an abrupt drop off of threshold voltage with the effective channel length ($L_{eff}$).

Further, the drain is preferred to be shallow and laterally graded as to profile as well as concentration. That is, it is desired for the drain profile to have a gradual decrease in surface concentration from the $n^+$ regions to the channel region. Less desirable is the profile shape where the source/drain regions exhibit similar lateral grading but with deeper vertical junctions. With deeper junctions, there is a wider subsurface depletion effect and it is easier for the field lines to go from the drain to the source, which causes "punchthrough current" problems and shorts out the device.

A known alternative to the graded source/drain structure is the use of lightly doped drains (LDDs). LDDs consist of a lightly doped source/drain region that is driven just under the gate region, while the heavily doped drain region is laterally displaced away from the gate by used of a sidewall spacer on the gate. LDDs are advantageous because they do not have problems with excess lateral or vertical impurity diffusion. However, the process for making LDDs can be complex, and typically requires the formation of a sidewall spacer on the gate to provide the exact horizontal and/or lateral displacement of the lightly and heavily doped drain sections. that is, in LDDs, the $n^-$ portion of the source/drain region is aligned to the polysilicon gate edge, and the $n^+$ portion of the source/drain region is aligned to a spacer edge.

Another alternative to these structures is a double diffused drain (DDD). This feature is similar to the graded source/drain discussed above, except that in this case, arsenic and phosphorus are implanted together, or are introduced into the same area, and are diffused together to form the source/drain structure. That is, both the $n^-$ and $n^+$ portions of the source/drain regions are aligned to the polysilicon gate edge. The process for making DDDs is very simple compared to that for making graded source/drains or LDDs in that the impurity introduction is performed essentially all at one time, and the anneal for both phosphorus and arsenic is performed together. However, the disadvantage with the DDD structure is that due to cooperative diffusion effects, phosphorus tends to diffuse faster in the presence of high arsenic doping, even faster than phosphorus diffuses alone. This undesirable effect that enhances the phosphorus diffusion discourages the use of arsenic and phosphorus together in a DDD, and phosphorus alone or GSDs and LDDs are used instead.

Shown in FIG. 2 is a pair of prior art MOSFETs 10 on a semiconductor substrate 12, such as silicon, covered by a thin gate dielectric material 14. It will be appreciated that the substrate 12 may be a well within a wafer or expitaxial layer, or an epitaxial layer itself, and that for PMOS devices the substrate 12 is n-type as shown in the right side of FIG. 1 and for NMOS devices, the substrate 12 is p-type as shown on the left. Upon the thin gate dielectric material 14 is a patterned gate material 15 having opposing sides adjacent which are source/drain regions 16 through 19. It will be appreciated that the source/drain regions 16, and especially $n^-$ and $p^-$ source/drain regions 17 are deeper than desired due to the accelerated phosphorus diffusion of heavily doped phosphorus, and thus these LDDs suffer from the same disadvantages as the graded source/-drains with deep junctions discussed above. The same accelerated diffusion phenomenon is observed for boron in the source/drain regions 18 and 19 of the PMOS devices, but to a lesser degree.

A particular need is to provide a workable salicided twin-tub CMOS process. It will be understood that the terms "salicidation" and "silicidation" as used herein refer to the formation of a self-aligned refractory metal silicide on a silicon surface through the reaction of a refractory metal with the silicon surface. The surface may be amorphous, polycrystalline or monocrystalline silicon.

Salicidation of shallow junctions has been shown to result in increased leakage current with can be aggravated by the isolation edge pull back for a LOCOS (local oxidation of silicon) based isolation. Additional source/drain implantation after titanium deposition either before or after silicidation have been proposed to minimize these problems.

However, the high dose phosphorus and boron implants which are performed through the silicide layer to form the $n^+$ and $p^+$ regions result in an enhanced diffusivity in the $n^-$ and $p^-$ regions causing anomalously deep source/drain junctions with degraded device punchthrough leakage. This is confirmed by electrical measurements in which an increase in the electrical channel length by 0.15 $\mu$m and a corresponding decrease in punchthrough leakage are observed when arsenic is used instead of phosphorus for the $n^+$ source/drain implant. Due to the high stopping power of arsenic in titanium silicide, high implant energies such as 190 keV are required to see improvements in short-channel effects while maintaining low diode leakage and contact resistance. Evidence exists that such high implant energies tend to adversely shift the threshold voltage of the device, although the reason for this is unknown. The use of arsenic will be limited, therefore, by implantation throughput and potential penetration into the gate oxide. One might argue that arsenic may be employed in a salicided CMOS process by implantation through the silicided layers after the phosphorus has been placed if a thin enough silicide is used. However, such thin silicide layers have the disadvantage of high sheet resistance which is not desired for the circuit speed.

Conventional twin-tub CMOS processes which use low temperature oxide (LTO) sidewall spacers for both the LDD and salicide formation are known. See, for example, U.S. Pat. No. 4,722,909 to Motorola.

Thus, an acceptable process for forming CMOS devices with salicided contacts is desired that does not have these difficulties.

SUMMARY OF THE INVENTION

Accordingly, it is an object of the present invention to provide CMOS FETs with low junction leakage and good short-channel effects.

It is another object of the present invention to provide CMOS FETs that have restricted diffusion of the source/drain regions and lightly doped source/drain regions during processing.

It is yet another object of the invention to provide a process for making CMOS FETs with the above advantages that is easily integrated into current process sequences, and in one aspect without the employment of an additional mask.

It would be desirable if the MOSFET 10 would have source/drain regions with a profile more like the shallow profiles shown by $n^+$ source/drain regions 44 and $n^-$ source/drain regions 42 in the improved MOSFET 20 of the invention illustrated in FIG. 1. Here the source/drain regions 42 and 44 have the desired profile, satisfactory lateral grading with shallow vertical junction depths. The presence of germanium in regions 42 and 44 helps retard the phosphorus diffusions. Corresponding regions 46 and 48 for the PMOS devices are also shallower, although as noted earlier the compensating effect of the germanium is not as great for boron. The edges of the source/drain regions also have sufficient concentration just beneath the gate. In the LDD structures of FIG. 2, the n-type and p-type impurity regions 17 and 19, respectively, are deeper into the substrate 12 region. It will be appreciated that in the structure of FIG. 1, the primary impurity concentration remains at the surface of the semiconductor substrate, rather than undesirably deeper as in prior structures. It would thus be advantageous if a process could be devised with would produce source/drain regions that would help solve HCI effects, but also be less susceptible to unwanted diffusion, as well as be easy to manufacture.

In carrying out these and other objects of the invention, there is provided, in one form, a process for fabricating a FET on a semiconductor substrate involving first providing a semiconductor substrate having a surface and then providing a dielectric layer over the surface of the semiconductor substrate. Next, a conductive gate is provided on the dielectric layer. Then, germanium is introduced into selected regions of the semiconductor substrate on either side of the conductive gate in future source/drain regions. At least a portion of the dielectric layer is removed over the future source/drain regions to form openings. Refractory metal silicide layers are next formed in the openings in the dielectric layer over the future source/drain regions. A conductivity altering dopant is then introduced into the future source/drain regions in the substrate. Finally, the substrate is annealed to drive-in the conductivity altering dopant to form source/drain regions, whereby the diffusion of the dopant is retarded by the presence of the germanium.

It will be appreciated that in the Figures showing device cross sections, such as FIGS. 1-8, that the various structures are not shown to scale. For example, the vertical dimension is generally exaggerated out of proportion to the horizontal dimension for clarity.

DETAILED DESCRIPTION OF THE INVENTION

The invention will now be described in more detail with reference to the various Figures. A novel salicided twin-tub CMOS process using germanium implantation has been developed and characterized. Implantation of $n+$ and $p+$ dopants after titanium salicidation are employed to fabricate devices with low junction leakage and good short-channel effects. The diffusion for the $n+$ junction depths can be limited even if phosphorus is the only dopant used.

One version of the CMOS process uses low temperature oxide (LTO) sidewall spacers for both the LDD and salicide formation. Prior to the refractory metal deposition, which may be titanium, for example, and salicidation, a germanium implant with doses ranging from 1E15 to 5E15 $cm^{-2}$ is performed. Phosphorus and boron are then selectively implanted through the titanium silicide layer to form the $n+$ and $p+$ source/drain regions, respectively. Split wafer lots on the $n+$ and $p+$ implant energy were fabricated to examine trade-offs between junction quality and short-channel device behavior. As the implant energy increased, junction leakage and contact resistance are reduced at the expense of degraded short-channel effects due to the deeper junctions caused by additional dopant which is implanted through the silicide layer into the silicon substrate.

Figures 3, 4:
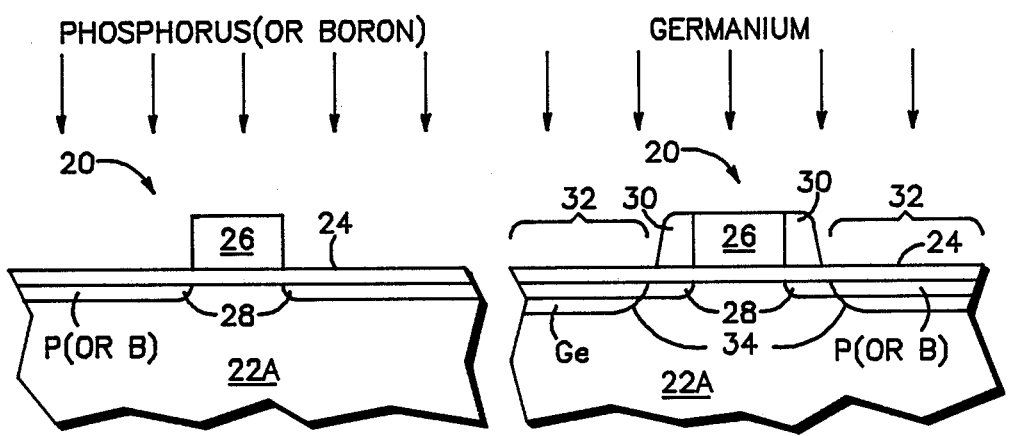
FIG. 3 is a cross sectional illustration of one half of CMOS FET structure of the invention being fabricated at early stage.
FIG. 4 is a cross sectional illustration of the CMOS FET under construction from FIG. 3 during the germanium introduction in one of the process aspects.

The starting point of one embodiment of the process for fabricating the CMOS FETs 20 of the present invention is shown in FIG. 3. Fabrication of only one of the device types will be described, since the processing steps for the devices of the other type is essentially identical except for the dopants used. The FIGS. indicate in parentheses that the impurity of the other conductivity type will form the devices of the other type.

A semiconductor substrate 22 is provided over which a dielectric layer 24 is formed. Semiconductor substrate has two lightly doped portions or wells 22A and 22B, which are p-wells and n-wells, respectively, for NMOS and PMOS devices, respectively. Conductive gates 26 are then provided on the dielectric layer 24 by forming a uniform layer and then patterning with conventional photolithographic techniques. Typically, the substrate 22 may be monocrystalline silicon, the dielectric layer 24 may be silicon dioxide or silicon nitride or a combination of the two, and the conductive gates may be doped polycrystalline silicon, although it will be appreciated that the process and structure herein is not limited to these particular materials and that others may be used within the scope of the invention. FIG. 3 further depicts the implantation of phosphorus for the formation of implanted $n-$ regions 28. As indicated, for the PMOS devices, boron would be implanted for corresponding $p-$ regions.

Shown in FIG. 4 is the structure of FIG. 3 after a sidewall spacer 30 has been formed thereon. Sidewall spacer 30 may be formed by conventional techniques, such as providing a conformal layer over the entire wafer surface and then performing an anisotropic etch to leave only the spacers 30. Typically, such spacers may be silicon dioxide, such as LTO, but it will be appreciated that other materials, such as silicon nitride or undoped poly may be used. At the point of the process illustrated in FIG. 4, germanium is blanket implanted on either side of the conductive gates 26 into future source/drain regions 32. The depth of region of germanium implant 34 may not actually extend beyond that of implanted phosphorus 28 as shown, but would have the lateral relationship thereto as shown.

Figures 5, 6:
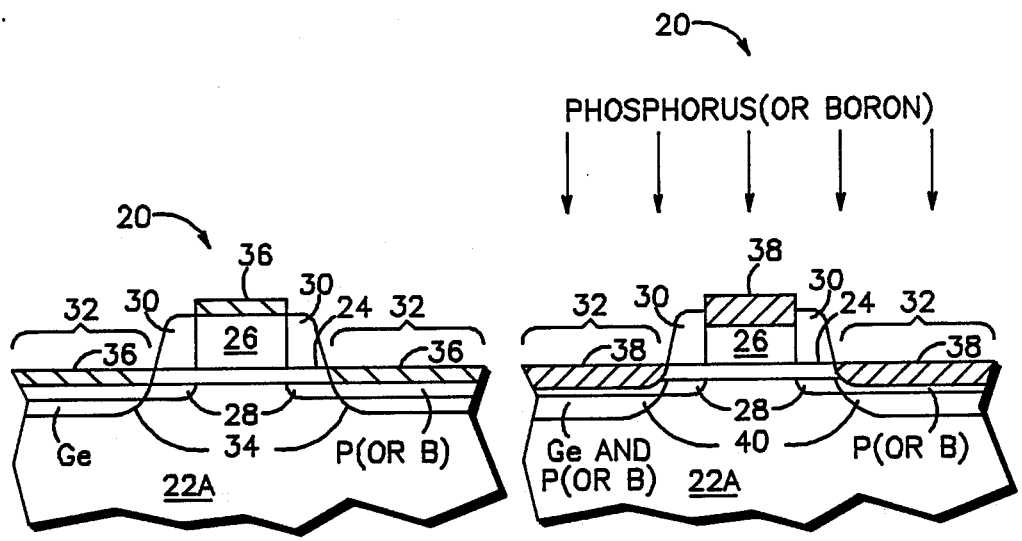
FIG. 5 is a cross sectional illustration of the CMOS FET of FIG. 4 after a refractory metal has been provided thereon.
FIG. 6 is a cross sectional illustration of the CMOS FET of FIG. 5 during introduction of the high impurity level source/drain regions.
Figures 7, 8:
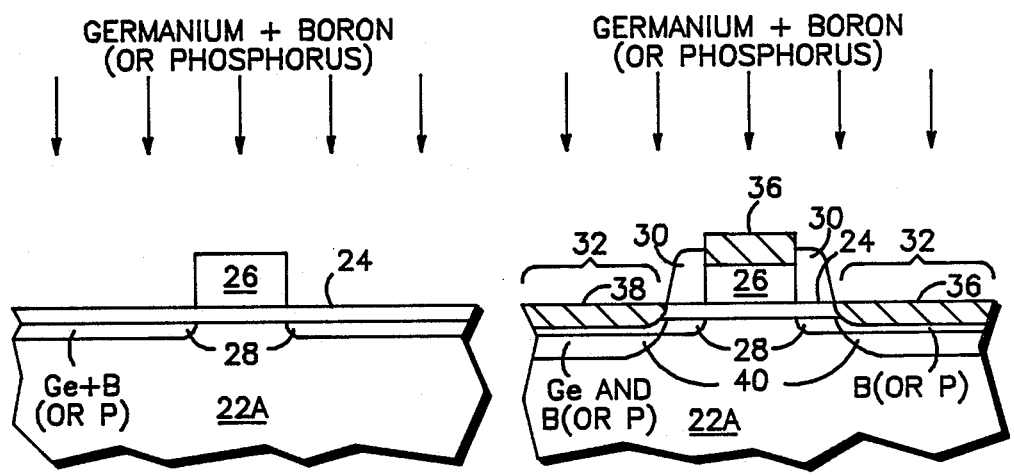
FIG. 7 is a cross sectional illustration of an alternate process embodiment where the germanium is introduced early in the fabrication process.
FIG. 8 is a cross sectional illustration of another alternate process aspect of the invention where the germanium is co-introduced into the substrate through the refractory metal silicide along with the dopant for the relatively heavily doped source/drain regions.

Shown in FIG. 5 is the structure of FIG. 4 after the portions of the thin dielectric layer 24 over the future source/drain regions 32 has been removed by etching or other means to form openings, and a refractory metal layer 36 has been selectively provided in the openings over the future source/drain regions 32 and the conductive gate 26. If the sidewall spacer 30 is LTO or other oxide, the thin dielectric layer 24 may be removed to form openings in the same step as the anisotropic etch that forms sidewalls 30. The layer 36 may be formed by a selective process that only forms the refractory metal material on a silicon surface, such as amorphous, polycrystalline or monocrystalline silicon, or upon whatever material the substrate and the conductive gate happen to be. Additionally, the process of the present invention anticipates that the refractory metal silicide layers 38 shown in FIG. 6 may also be formed by depositing a uniform layer of the refractory metal and then thermally reacting the portions of the refractory metal over the silicon to form the silicides 38. Subsequently, the unreacted refractory metal may be selectively removed, leaving only the silicide layers. Even if the refractory metal layers 36 may be selectively provided, some reaction must take place to convert them to the silicides shown in FIG. 6. Of course, this reaction consumes some of the underlying silicon. Suitable refractory metals include titanium, tungsten, platinum, cobalt, among others.

Also shown in FIG. 6 is the implantation of phosphorus in a relatively heavy dose through the refractory metal silicide layers 38 to form $n+$ regions 40. Regions 40 are self-aligned to the sidewall spacer 30. As noted earlier, for the PMOS devices, boron would be introduced. As a result of the phosphorus implantation, implanted germanium and phosphorus regions 40 are formed in the future source/drain regions. Implanted germanium regions 34 are incorporated or superimposed on these regions.

Figure 1:
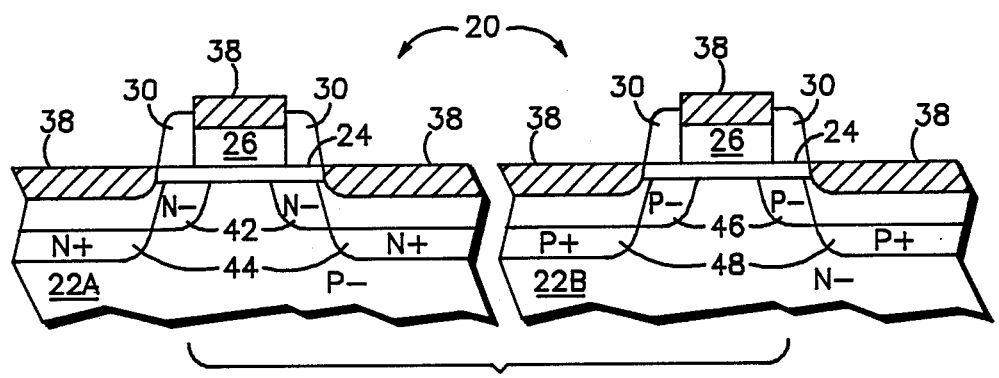
FIG. 1 is a cross sectional illustration of the CMOS FET structure of the present invention in its finished state.
Figure 2:
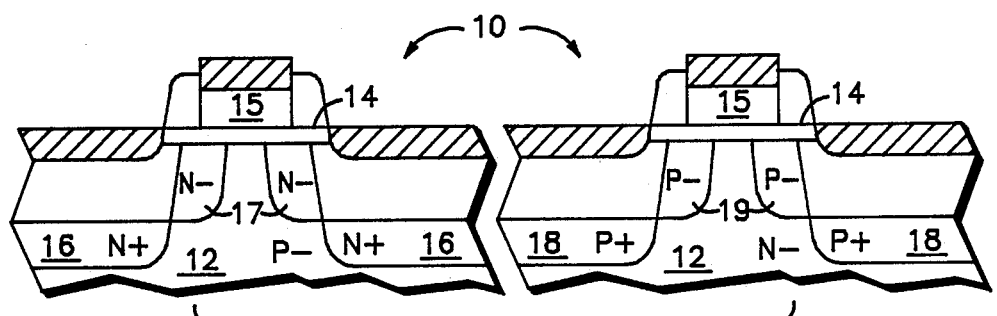
FIG. 2 is a cross sectional illustration of a prior art CMOS FET structure.

Next, the implanted regions 28 and 40 are driven in by a thermal drive-in or anneal step to form $n-$ source/drain extensions or LDDs 42 and $n+$ source/drain regions 44 as shown in FIG. 1. With appropriate masking of the NMOS devices on the left side of FIG. 1, the PMOS devices on the right side of FIG. 1 may be provided in a manner similar to that described above. The PMOS devices will have $p-$ regions 46 and $p+$ regions 48. Note that the source/drain regions 42, 44, 46 and 48 which have had their diffusions affected by germanium are considerably shallower than corresponding regions 17, 16, 19 and 18 of the CMOS devices 10 seen in prior art FIG. 2.

Figure 9:
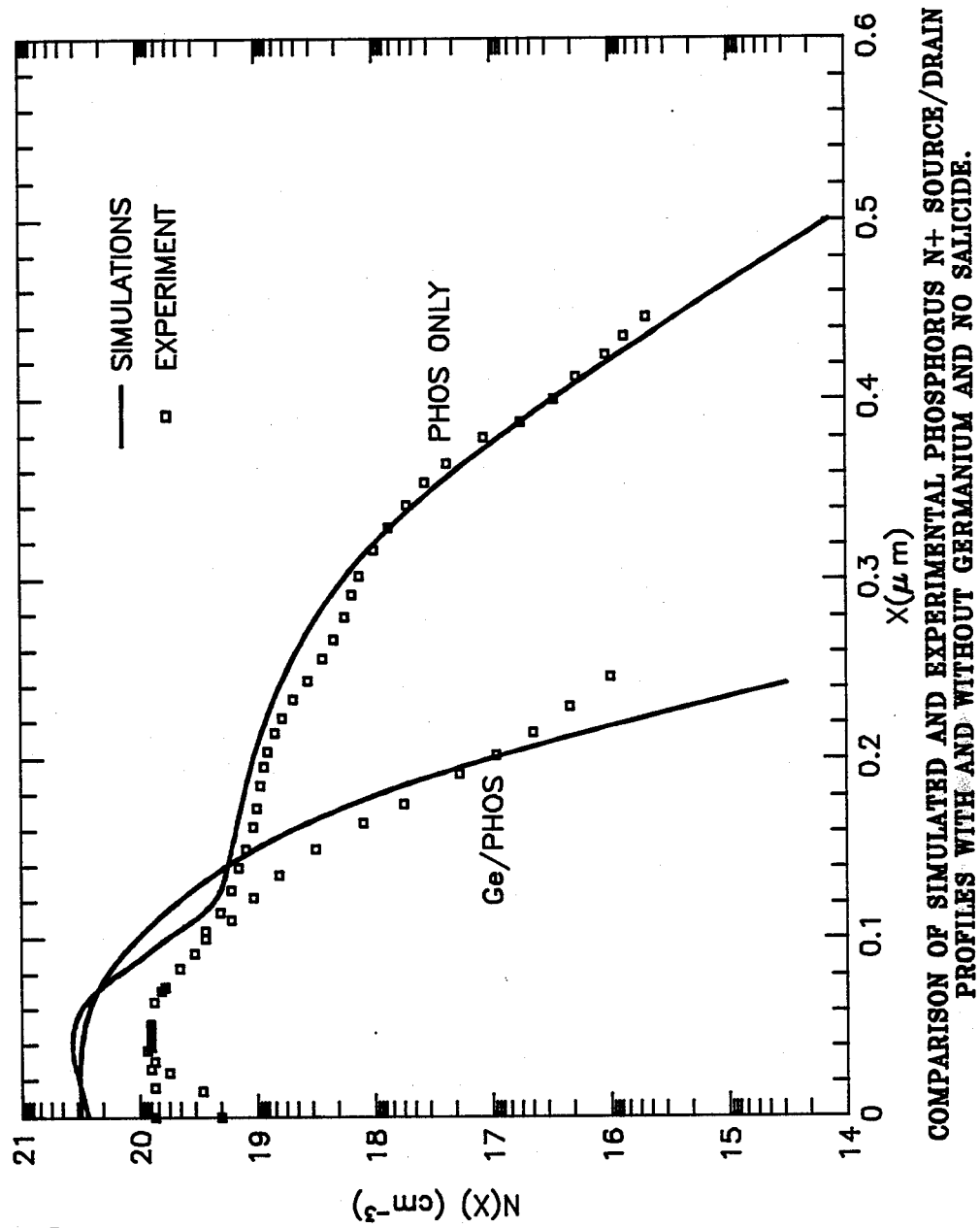
FIG. 9 is a plot of dopant concentration with junction depth for simulated and experimental cases of phosphorus only, and phosphorus plus germanium for an $n^+$ source/drain profile.
Figure 10:
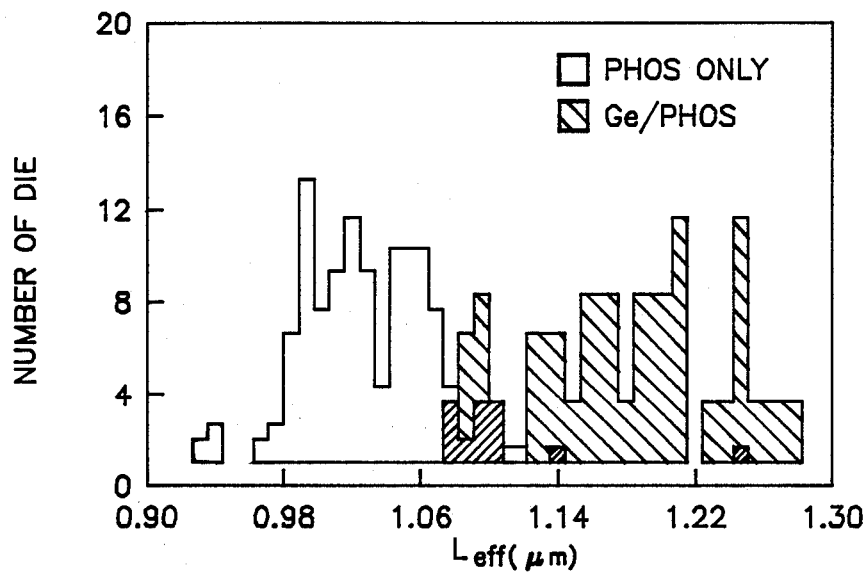
FIG. 10 is histogram plot of the number of die with a particular $L_{eff}$ for NMOS devices with phosphorus only source/drains as compared with NMOS devices with both germanium and phosphorus in the source/drains.

Since the diffusion of phosphorus and boron is reduced in the presence of germanium due to a reduction in the silicon point defect generation rate, shallow low-leakage junctions with reduced lateral diffusion as seen in FIG. 1 are shown to result in improved NMOS and PMOS short channel behavior. Both spreading resistance and electrical device measurements indicated that the lateral diffusion of the $n-$ and $p-$ regions 42 and 46 respectively, is reduced by as much as 0.15 μm when germanium implantation is performed prior to titanium deposition. See, for example, FIG. 9, which clearly indicates that the diffusion of phosphorus is retarded by the presence of germanium; the diffusion of phosphorus into the silicon is not nearly as large as in the absence of Ge. Note also the histogram plotted in FIG. 10 showing the longer $L_{eff}$ for those devices using germanium as compared to those without.

Figure 11:
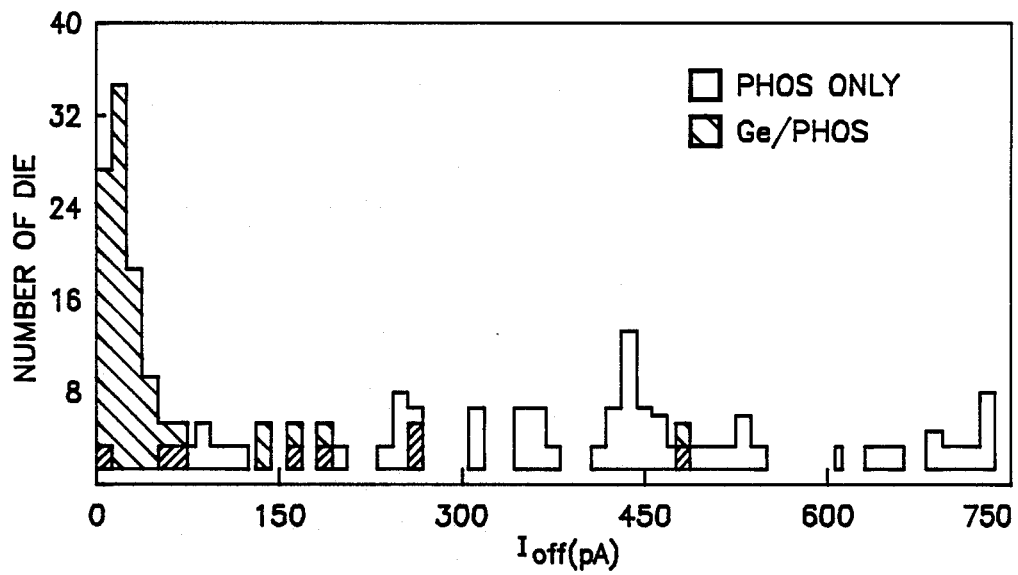
FIG. 11 is histogram plot of the number of die with a particular off current ($I_{off}$) as a function of leakage capacitance for NMOS devices with phosphorus only source/drains as compared with NMOS devices with both germanium and phosphorus in the source/drains.

Diode leakage was less than 10 nA/cm$^2$ for a 5V bias at room temperature for both cases. As shown by the histogram in FIG. 11, the device off current ($I_{off}$) measured at $V_{gs}=0.3V$ and $V_{ds}=8V$ was approximately 10 to 100 times larger for the corresponding 1.1 μm channel length NMOS device without germanium. In addition, no significant degradation to long-channel device behavior, sheet resistance, contact resistance, junction breakdown, or gate breakdown was observed with germanium implantation. Thus, germanium implantation prior to titanium deposition combined with post source/drain implantation can be used to form shallow low-leakage source/drain junctions for submicron CMOS technologies. Also, since the projected implantation range for phosphorus is greater than arsenic, thicker titanium silicide layers with lower sheet resistance are possible with the method of this invention.

We claim:

1. A process for fabricating a field effect transistor (FET) on a semiconductor substrate, comprising the steps of:
   providing a semiconductor substrate having a surface;
   providing a dielectric layer over the surface of the semiconductor substrate;
   providing a conductive gate on the dielectric layer; and thereafter performing the following steps in the following order:
   introducing germanium into future source/drain regions of the semiconductor substrate on either side of the conductive gate;
   removing at least a portion of the dielectric layer over the future source/drain regions to form openings;
   forming refractory metal silicide layers in the openings in the dielectric layer over the future source/drain regions;
   introducing a conductivity altering dopant into the future source/drain regions in the substrate; and
   annealing the conductivity altering dopant to form source/drain regions whereby the diffusion of the dopant is retarded by the presence of the germanium.

2. The process of claim 1 wherein the semiconductor substrate is selected from the group consisting of polycrystalline, monocrystalline and amorphous silicon, and the conductivity altering dopant is selected from the group consisting of phosphorus and boron.

3. The process of claim 1 wherein the refractory metal is titanium.

4. The process of claim 1 wherein after the provision of the conductive gate, a sidewall spacer is formed around the gate, and further wherein the future source/drain regions are spaced apart from the gate by the sidewall spacer.

5. The process of claim 1 wherein the conductivity altering dopant is implanted through the refractory metal silicide.

6. A process for fabricating a field effect transistor (FET) on a semiconductor substrate, comprising the steps of:
   providing a semiconductor substrate having a surface;
   providing a dielectric layer over the surface of the semiconductor substrate;
   providing a gate electrode on the dielectric layer; and thereafter performing the following steps in the following order:
   introducing germanium into future source/drain regions of the semiconductor substrate on either side of the conductive gate;
   introducing a first conductivity altering dopant into future source/drain regions of the semiconductor substrate on either side of the gate electrode;
   removing at least a portion of the dielectric layer over the future source/drain regions to form openings;
   forming refractory metal silicide layers in the openings in the dielectric layer over the future source/drain regions;
   introducing a second conductivity altering dopant into the future source/drain regions in the substrate; and
   annealing the conductivity altering dopants to form source/drain regions whereby the diffusion of the dopant is retarded by the presence of the germanium.

7. The process of claim 6 wherein the semiconductor substrate is selected from the group consisting of polycrystalline, monocrystalline and amorphous silicon, and the conductivity altering dopant is selected from the group consisting of phosphorus and boron.

8. The process of claim 6 wherein the refractory metal is titanium.

9. The process of claim 6 wherein after the provision of the conductive gate, a sidewall spacer is formed around the gate, and further wherein the future source/drain regions are spaced apart from the gate by the sidewall spacer.

10. A process for fabricating a field effect transistor (FET) on a semiconductor substrate, comprising the steps of:
    providing a semiconductor substrate having a surface;
    providing a dielectric layer over the surface of the semiconductor substrate;
    providing a conductive gate on the dielectric layer; and performing the following steps in the following order:
    introducing a first conductivity altering dopant into future source/drain regions of the semiconductor substrate on either side of the conductive gate;
    forming sidewall spacers around the conductive gate;
    introducing germanium into future source/drain regions in the semiconductor substrate on either side of the sidewall spacers of the conductive gate;
    removing at least a portion of the dielectric layer over the future source/drain regions to form openings;
    forming refractory metal silicide layers in the openings in the dielectric layer over the future source/drain regions;
    introducing a second conductivity altering dopant into the future source/drain regions in the substrate; and annealing the conductivity altering dopants to form source/drain regions whereby the diffusion of the dopant is retarded by the presence of the germanium.

11. The process of claim 10 wherein the semiconductor substrate is selected from the group consisting of polycrystalline, monocrystalline and amorphous silicon, and the conductivity altering dopant is selected from the group consisting of phosphorus and boron.

12. The process of claim 10 wherein the refractory metal is titanium.

13. The process of claim 10 wherein the first conductivity altering dopant and the second conductivity altering dopant are selected from the group consisting of phosphorus, arsenic and boron, and the first conductivity altering dopant has a first impurity level and the second conductivity altering dopant has a second impurity level and the second impurity level is relatively greater than the first impurity level.

14. A process for fabricating a field effect transistor (FET) on a semiconductor substrate, comprising the steps of:

providing a silicon substrate having a surface;
providing a silicon dioxide layer over the surface of the silicon substrate;
providing a conductive gate on the silicon dioxide layer;
introducing phosphorus at a low impurity level into the silicon substrate on either side of the gate;
providing a sidewall spacer around the gate; and performing the following steps in the following order;
introducing germanium into future source/drain regions of the silicon substrate on either side of the sidewall spacer around the conductive gate;
removing at least a portion of the dielectric layer over the future source/drain regions to form openings on either side of the sidewall spacer;
forming a titanium silicide layer in the openings in the dielectric layer over the future source/drain regions;
introducing phosphorus at a high impurity level into the future source/drain regions in the substrate; and
annealing the conductivity altering dopant to form source/drain regions whereby the diffusion of the phosphorus is retarded by the presence of the germanium.

* * * * *